(12) United States Patent
Morita et al.

(10) Patent No.: US 6,798,078 B2
(45) Date of Patent: Sep. 28, 2004

(54) POWER CONTROL DEVICE WITH SEMICONDUCTOR CHIPS MOUNTED ON A SUBSTRATE

(75) Inventors: Koji Morita, Iwata (JP); Takayuki Murai, Iwata (JP); Takao Yoshikawa, Iwata (JP)

(73) Assignee: Yamaha Hatsudoki Kabushiki Kaisha, Shizuoka (JP)

( * ) Notice: Subject to any disclaimer, the term of this patent is extended or adjusted under 35 U.S.C. 154(b) by 0 days.

(21) Appl. No.: 10/022,297

(22) Filed: Dec. 12, 2001

(65) Prior Publication Data

US 2002/0074651 A1 Jun. 20, 2002

(30) Foreign Application Priority Data

| Dec. 14, 2000 | (JP) | ........................................ | 2000-379567 |
| Dec. 14, 2000 | (JP) | ........................................ | 2000-379569 |
| Feb. 27, 2001 | (JP) | ........................................ | 2001-052498 |

(51) Int. Cl.$^7$ .................................................. H01L 23/28
(52) U.S. Cl. ........................ 257/787; 257/747; 257/779
(58) Field of Search ................................ 257/678, 747, 257/779, 787, 791; 174/260

(56) References Cited

U.S. PATENT DOCUMENTS

| 5,373,190 A | * | 12/1994 | Ichiyama ..................... 257/737 |
| 5,468,993 A | * | 11/1995 | Tani ............................ 257/696 |
| 5,668,059 A | * | 9/1997 | Christie et al. ............. 438/118 |
| 5,783,865 A | * | 7/1998 | Higashiguchi et al. ...... 257/774 |
| 5,793,150 A | * | 8/1998 | Kober et al. ................ 311/338 |
| 5,808,878 A | * | 9/1998 | Saito et al. ................. 361/818 |
| 5,844,305 A | * | 12/1998 | Shin et al. .................. 257/676 |
| 5,969,426 A | * | 10/1999 | Baba et al. ................. 257/778 |
| 5,973,931 A | * | 10/1999 | Fukasawa ................... 361/774 |
| 6,181,003 B1 | * | 1/2001 | Ohuchi ........................ 257/690 |
| 6,259,157 B1 | * | 7/2001 | Sakamoto et al. .......... 257/723 |

FOREIGN PATENT DOCUMENTS

| JP | 53143656 A | * | 5/1977 | ........... B29G/3/00 |
| JP | 63213936 | * | 9/1988 | ........... H01L/21/58 |
| JP | 363213936 A | * | 9/1988 | ........... H01L/21/56 |
| JP | 406177178 | * | 6/1994 | ........... H01L/21/52 |
| JP | 406275942 A | * | 9/1994 | ........... H05K/3/28 |
| JP | 08-264674 | * | 11/1996 | ........... H01L/23/04 |
| JP | 409330993 A | * | 12/1997 | ........... H01L/23/12 |
| JP | 2788465 | | 8/1998 | |
| JP | 020000253570 A | * | 2/1999 | ........... H02H/9/02 |
| JP | 411219981 A | * | 8/1999 | ........... H01L/21/60 |

* cited by examiner

*Primary Examiner*—Mary Wilczewski
*Assistant Examiner*—Monica Lewis
(74) *Attorney, Agent, or Firm*—Knobbe, Martens, Olson & Bear, LLP

(57) ABSTRACT

A semiconductor device for power control includes a substrate made of aluminum. Lands of copper are formed on the substrate. Semiconductor chips, such as FETs, are mounted on the lands. The semiconductor chips are joined with the lands only through solder layers. A synthetic resin, which includes epoxide, covers the lands, the solder layers and the semiconductor chips on the substrate. Preferably, a coefficient of expansion of the synthetic resin is generally less than a coefficient of expansion of the substrate or a coefficient of expansion of the lands. Each semiconductor chip defines at least two corners positioned generally opposite to each other. Each land defines at least two corners disposed in proximity to the corners of the semiconductor chip. The corners of the land generally confine the corners of the semiconductor chip therein.

4 Claims, 10 Drawing Sheets

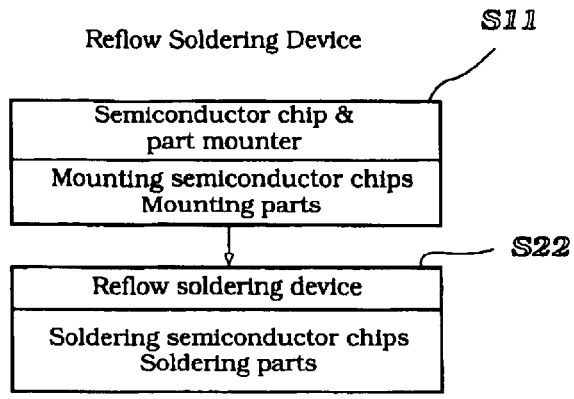
Figure 20
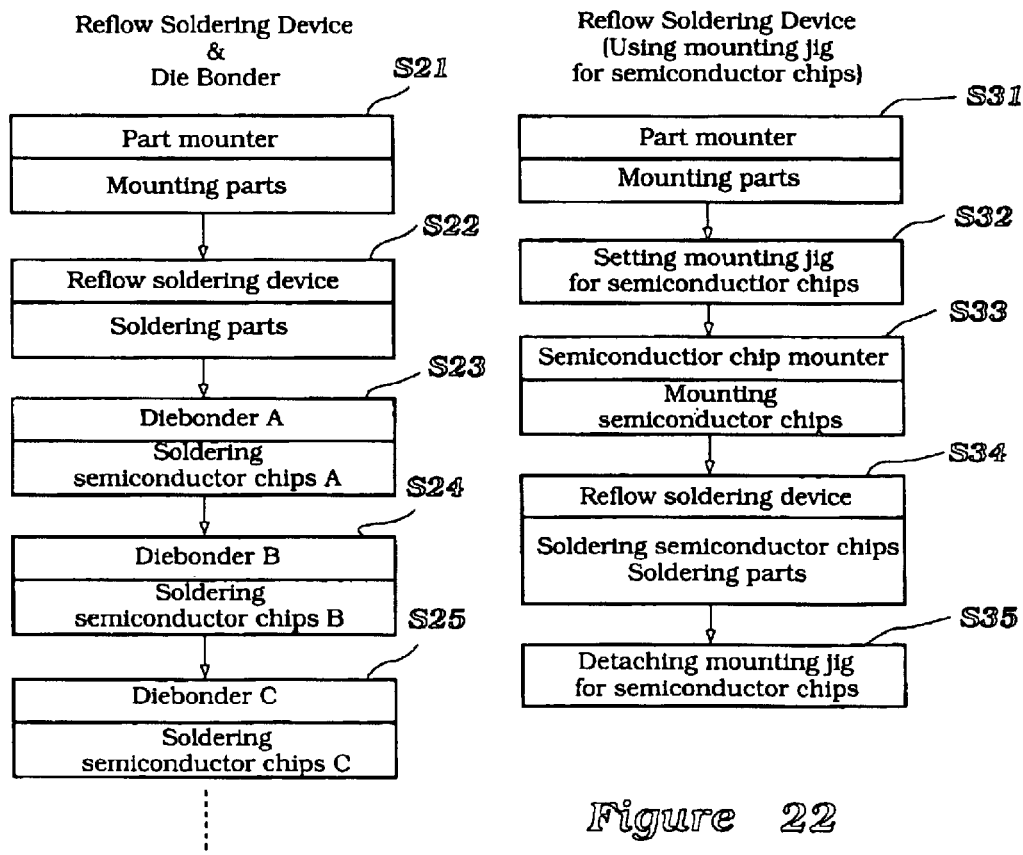
Figure 21
Figure 22

POWER CONTROL DEVICE WITH SEMICONDUCTOR CHIPS MOUNTED ON A SUBSTRATE

PRIORITY INFORMATION

This application is based on and claims priority to Japanese Patent Application No. 2000-379567, filed Dec. 14, 2000, Japanese Patent Application No. 2000-0379569, filed Dec. 14, 2000, and Japanese Patent Application No. 2001-052498, filed Feb. 27, 2001, the entire contents of which are hereby expressly incorporated herein by reference.

BACKGROUND OF THE INVENTION

1. Field of the Invention

The present invention relates to a semiconductor device and, more particularly, relates to an improved semiconductor device for power control in which a semiconductor chip is mounted on a substrate.

2. Description of Related Art

Semiconductor devices are utilized in wide variety of technical areas. For instance, a motor controller for an electrically operated vehicle such as, for example, an electric golf cart, includes a semiconductor device for power control of a motor that drives the golf cart. Typically, the semiconductor device that controls electric power is provided with one or more semiconductor chips that allow a relatively large current to flow therethrough. Because of the nature of power controlling semiconductor chips, the device can build much heat therein and needs a heat radiation structure. Thus, the semiconductor chips normally are placed on metallic heat spreaders that are mounted on metallic lands, which are formed on a metallic substrate, to expedite radiation of the heat. The heat spreaders are soldered onto the lands. The semiconductor chips are soldered onto the heat spreaders. Meanwhile, since a vehicle (for example, a golf cart) typically is used outdoors, the semiconductor device is exposed to a wet or dusty environment that can cause malfunctions of the device. In order to prevent the malfunctions from occurring, synthetic resin can be employed to entirely cover the semiconductor chips together with the lands.

FIGS. 1 and 2 schematically illustrate typical structures of a semiconductor device 10. A base metal 20 is coated with dielectric or insulating 22 to form a metallic substrate 24. Patterns of metallic lands 26 are formed on an upper surface of the substrate 24. Semiconductor chips 28 are joined to the metallic lands 26 via heat spreaders 30. More specifically, the semiconductor chips 28 are soldered onto the heat spreaders 30 with a solder layer 32 that has a relatively high melting point, and the heat spreaders 30 are then soldered onto the lands 26 with another solder layer 34 that has a relatively low melting point. Bonding wire pads 36 also are formed on the substrate 24 and are connected with the respective semiconductor chips 28 through bonding wires 38. After completion of the soldering and bonding processes, a synthetic resin 40 covers all the elements on the substrate 24.

FIG. 1 shows an example of the semiconductor device 10 that uses silicone gel for the synthetic resin 40. Because the viscosity of the silicone gel is relatively small, side walls 42 are applied to prevent the silicone gel from spilling before hardening. FIG. 2 shows another example of the semiconductor device 10 that uses epoxide. No side walls are necessary in this example because the epoxide has sufficient viscosity to stay on the substrate 24.

The heat spreaders 30 not only expedite radiation of the heat accumulating in the semiconductor chips 28 but also relieve the heat stress caused by disparity between the respective coefficients of the semiconductor chips 28 and the substrate 24. That is, the heat spreaders 30 cause the difference between the thermal expansion (or contraction) magnitude of the semiconductor chips 28 and the substrate 24 to be small. Accordingly, cracks of the solder layers 32, 34 or the semiconductor chips 28 and peeling of the semiconductor chips 28 from the solder layers 32, 34 are effectively prevented.

The usage of the heat spreaders 30, however, increases the number of parts, makes the semiconductor devices complicated and bulky, and increases the number of manufacturing processes. In addition, because the heat spreaders 30 are larger than the semiconductor chips 28, the lands 26 are inevitably large and require relatively wide spaces for them. Thus, the packaging density of the semiconductor chips 28 on the substrate 24 is diminished. A large casing that occupies a large area and has a large capacity may be necessary to accommodate the semiconductor chip 28.

A need therefore exists for an improved semiconductor device that has sufficient packaging density to make the device compact enough.

As thus far described, the soldering process is necessary for fixing the semiconductor chips onto the substrate. Several tools can be applied to hold the semiconductor chips in accurate positions, or each semiconductor chip can be soldered one by one for the same purpose. Both methods, however, need a number of steps and increase production cost accordingly.

Another need thus exists for an improved semiconductor device that can hold high accuracy of positioning of semiconductor chips without requiring expensive production cost.

SUMMARY OF THE INVENTION

In accordance with one aspect of the present invention, a semiconductor device comprises a substrate. A land is formed on the substrate. A semiconductor chip is mounted on the land. A solder layer is provided only through which the semiconductor chip is joined with the land. A synthetic resin covers the land, the solder layer and the semiconductor chip on the substrate.

In accordance with another aspect of the present invention, a semiconductor device comprises a substrate. A land is formed on the substrate. A semiconductor chip is mounted on the land. A solder layer joins the semiconductor chip with the land. The semiconductor chip defines at least two corners positioned generally opposite to each other. The land defines at least two corners disposed in proximity to the corners of the semiconductor chip. The corners of the land generally confine the corners of the semiconductor chip therein.

In accordance with a further aspect of the present invention, a method for joining a semiconductor chip to a substrate comprises forming a land on the substrate, soldering the semiconductor chip directly to the land, and covering the land and the semiconductor chip with a synthetic resin.

BRIEF DESCRIPTION OF THE DRAWINGS

These and other features, aspects and advantages of the present invention will now be described with reference to the drawings of preferred embodiments which are intended to illustrate and not to limit the invention. The drawings comprise 26 figures.

As noted above,

FIG. 20 is a flow chart showing production processes of the semiconductor device illustrated in FIGS. 15–19.

FIG. 21 is a flow chart illustrating other production processes of the semiconductor device.

FIG. 22 is a flow chart illustrating further production processes of the semiconductor device.

DETAILED DESCRIPTION OF THE PREFERRED EMBODIMENTS

An overall construction of a motor controller 50 for an electric is described below with reference to FIGS. 3–13.

The motor controller 50 includes a semiconductor device 52 configured in accordance with certain features, aspects and advantages of the present invention. The electric vehicle can be, for example, an electric golf cart, and the motor controller 50 can be an apparatus for controlling electric power supplied to a DC motor 54 of the golf cart. The motor controller 50, however, merely exemplifies one of apparatuses that can employ the semiconductor device 52. The golf cart also is only an example. The semiconductor device can be applied to other apparatuses and machines including other electrically powered vehicles, and can be used for other purposes in addition to power control. The apparatuses, machines, vehicles and purposes may be readily recognized along the spirit and scope of the invention, as defined by the appended claims.

Figure 1:
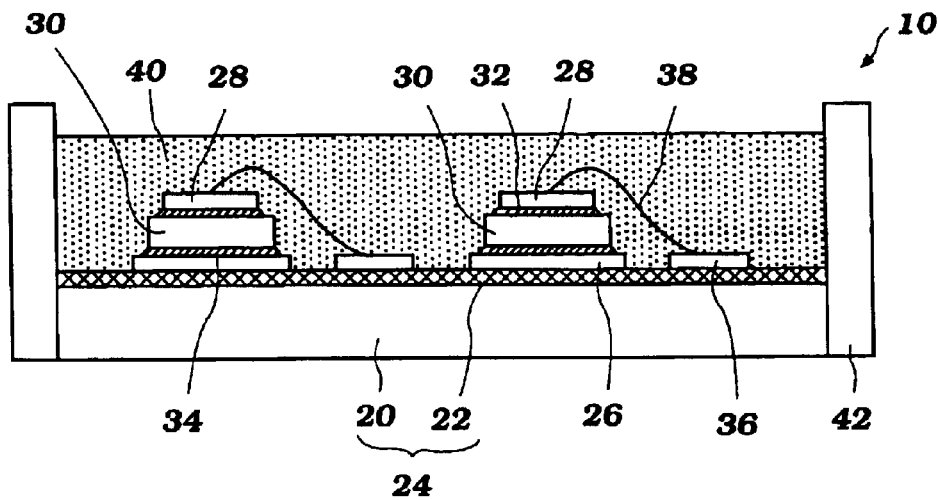
FIGS. 1 and 2 illustrate schematic views of conventional semiconductor devices. The figures are provided in order to assist in understanding the conventional arrangements and for comparison with the aspects, features and advantages associated with the present invention.
Figure 2:
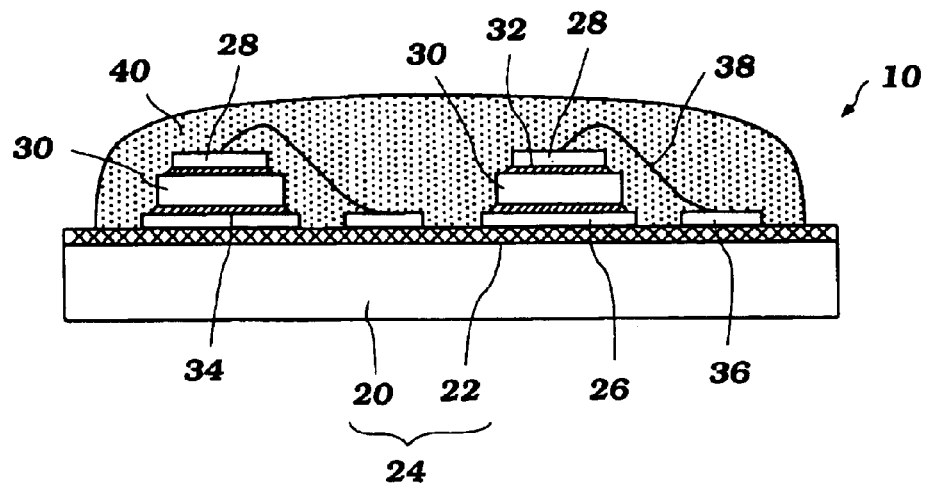
Figure 3:
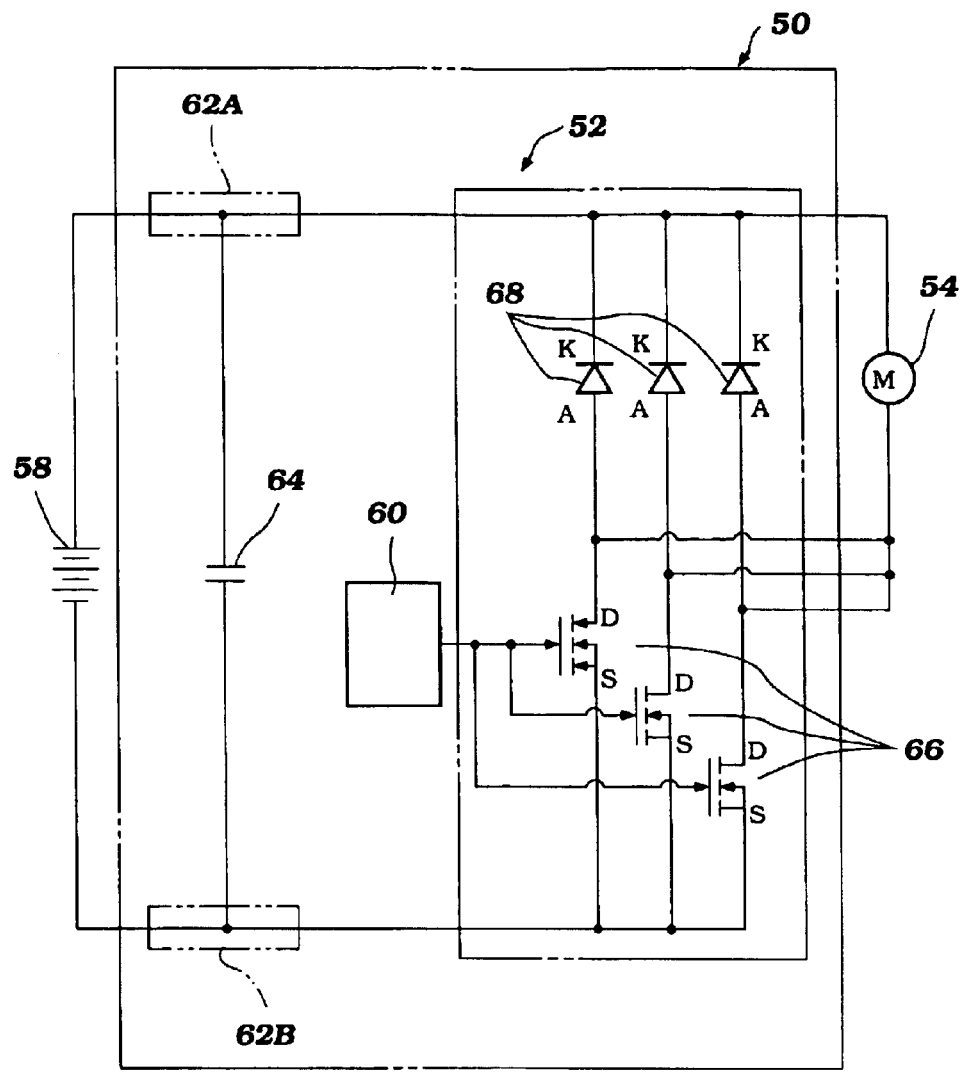
FIG. 3 is a circuit diagram of a motor controller for an electric golf cart that includes a semiconductor device configured in accordance with a preferred embodiment of the present invention.

With reference to FIG. 3, the motor controller 50, which includes the semiconductor device 52, is connected with the DC motor 54, a battery 58 and a speed control circuit 60 to supply electric power to the motor 54 from the battery 58 under control of the speed control circuit 60. More specifically, the motor controller 50 is a chopper type, DC motor power control apparatus. The battery 58 is coupled with a pair of terminal bars 62A, 62B of the motor controller 50. A smoothing capacitor 64 is disposed between the terminal bars 62A, 62B and is electrically connected in parallel with the battery 58 to reduce voltage ripples.

The semiconductor device 52 preferably comprises three field effect transistors (FETs) 66 and three diodes 68. The drains D of the respective FETs 66 are connected with a first terminal of the motor 54 so that the FETs 66 are arranged in parallel to each other in the circuit. The cathodes K of the respective diodes 68 are connected to a second terminal of the motor 54. The anodes A of the diodes 68 are connected to the respective drains D of the FETs 66 and to the first terminal of the motor 54. Thus, the diodes 68 are arranged in parallel to each other.

An output terminal of the speed control circuit 60 is connected to respective gates of the FETs 66. The operator of the golf cart can change voltage levels of the speed control circuit 60 by operating a control mechanism such as, for example, an accelerator pedal. The speed control circuit 60 controls the rotational speed or torque of the motor 54.

The FETs 66 are selectively turned on by the voltage level from the speed control circuit 60. Duty ratios, (i.e., duty cycles) of the FETs 66 are altered to control current that flows through the motor 54. Meanwhile, when one or more FETs 66 are turned off, the current circulates through the associated diodes 68. By contiguous alteration of the duty ratios of the FETs 66 under control of the speed control circuit 60, the rotational speed of the motor 54 can be smoothly changed.

Figure 4:
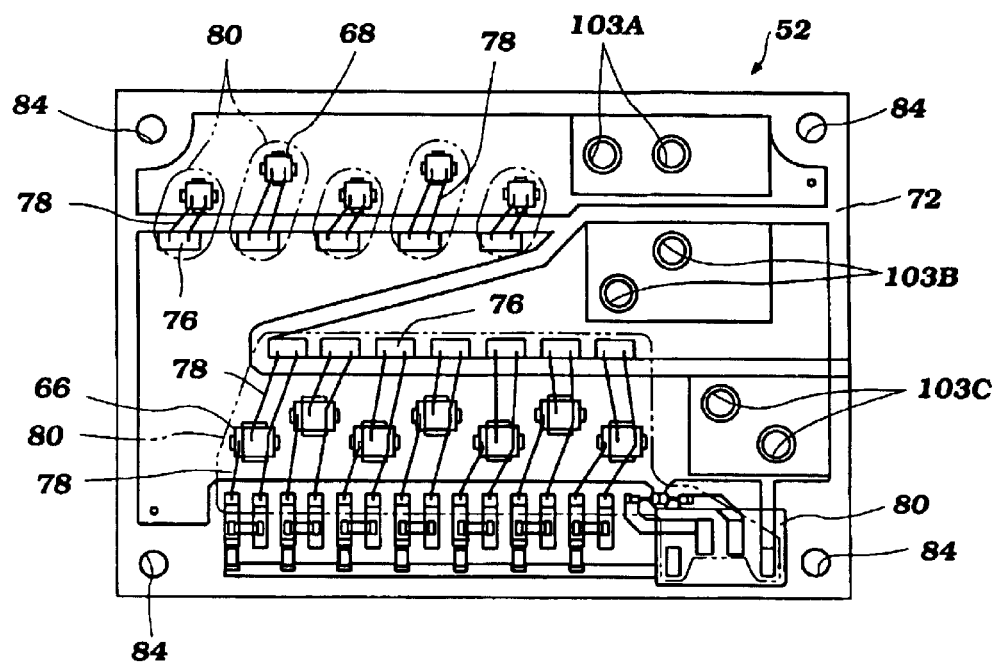
FIG. 4 is a plan view of the semiconductor device.
Figure 5:
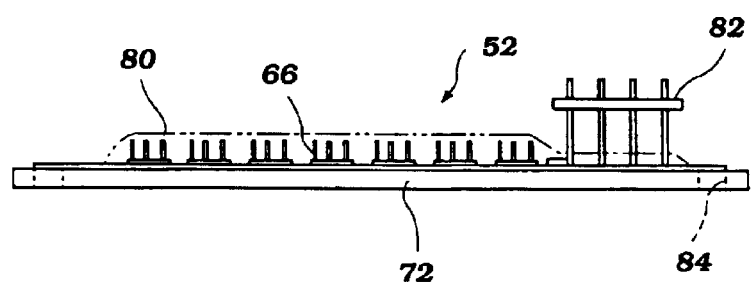
FIG. 5 is a front elevational view of the semiconductor device.

As shown in FIGS. 4 and 5, the illustrated semiconductor device 52 includes a printed wiring board 72. As used in the following description, the printed wiring board 72 may also be referred to as a metallic substrate or a substrate unless indicated otherwise or otherwise readily apparent from the context. The substrate 72 preferably is made of aluminum and has a rectangular shape. The FETs 66 and the diodes 68 are soldered onto the metallic substrate 72. Preferably, an insulating layer is formed on the substrate 72 by a surface treatment process prior to the soldering process. A circuit pattern is printed on the surface of the board 72. The FETs 66 and the diodes 68 are arranged in compliance with the pattern. A plurality of bonding wire pads 76 also are formed on the substrate 72. The FETs 66 and the diodes 68 are connected to the wire pads 76 by bonding wires 78. The FETs 66, the diodes 68, the wire pads 76 and the bonding wires 78 are covered with a synthetic resin 80 such as, for example, epoxide. Additionally, a plurality of pin connectors 82, which are connected with the respective FETs 66, extend upwardly from the printed wiring board or substrate 72. The printed wiring board 72 defines four openings 84 at four corners thereof.

Figure 6:
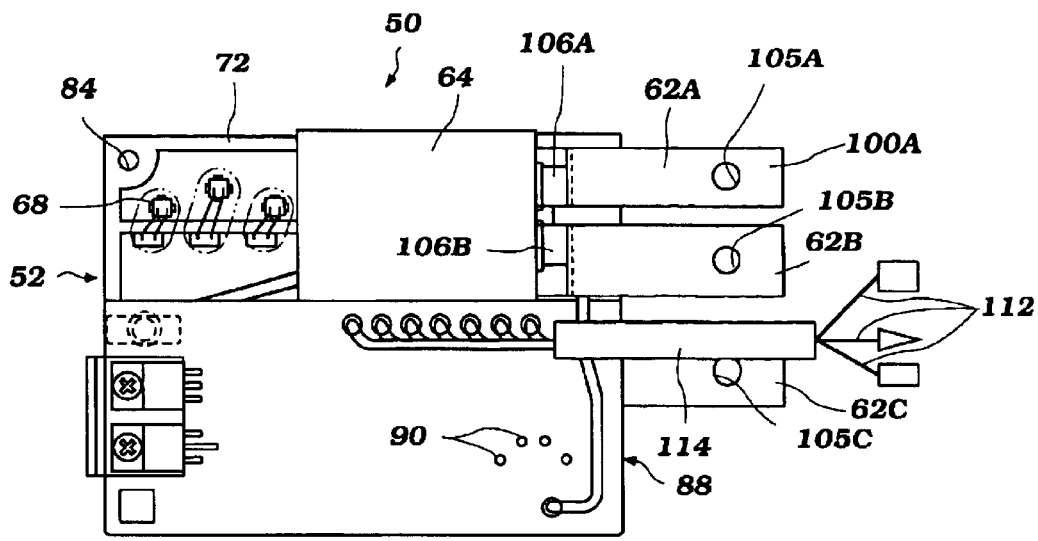
FIG. 6 is a top plan view of the motor controller without a casing.
Figure 7:
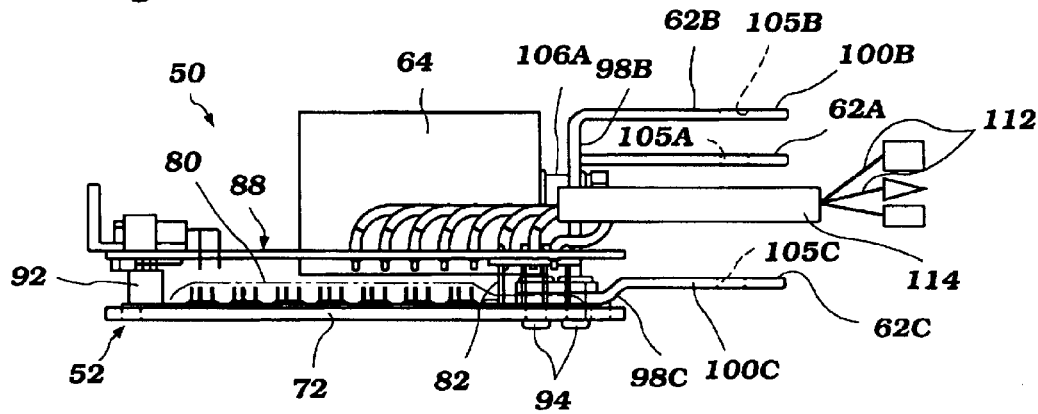
FIG. 7 is a front elevational view of the motor controller without a casing.
Figure 8:
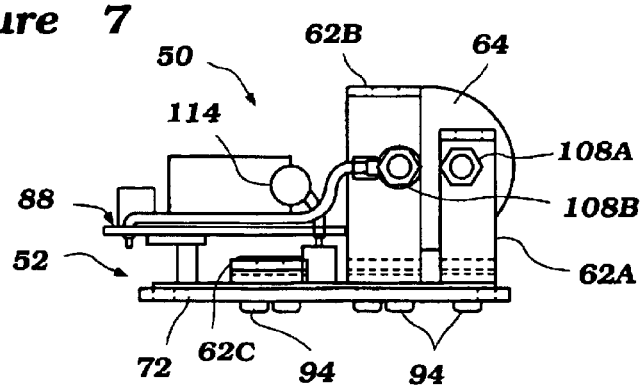
FIG. 8 is a side view of the motor controller without a casing viewed from a location on the right hand side.

As shown in FIGS. 6–8, a circuit board 88 is mounted on the printed wiring board 72. The circuit board 88 is approximately half the size of the printed wiring board 72. The circuit board 88 defines apertures 90 in which the pin connectors 82 are fitted. The pin connectors 82 and one or more spacers 92 support the circuit board 88 on the printed wiring board 72. The pin connectors 82 can be connected with the speed control circuit 60. The terminal bars 62A, 62B are affixed to the printed wiring board 72 by rivets 94 via insulators (not shown) and extend upwardly from the printed wiring board 72 next to the circuit board 88.

Figure 9:
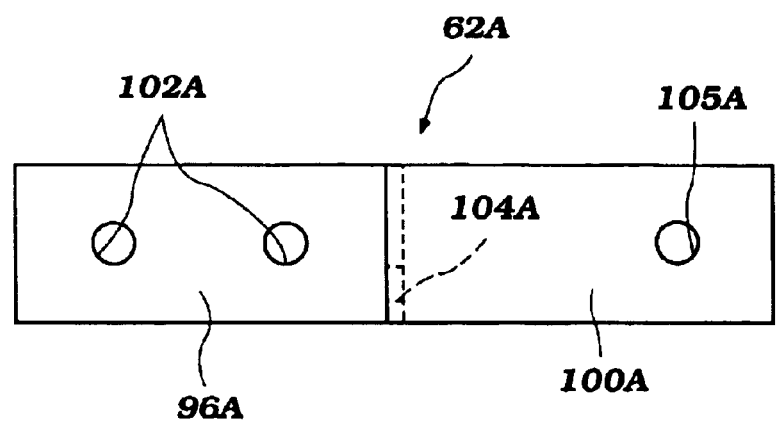
FIG. 9 is a plan view of a terminal bar for the motor controller.
Figure 10:
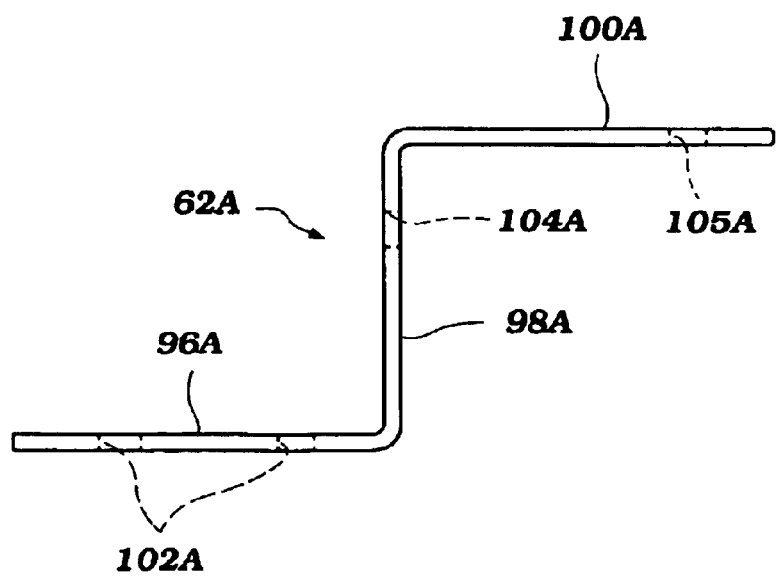
FIG. 10 is a front elevational view of the terminal bar.

As shown in FIGS. 9 and 10, the terminal bar 62A, for example, preferably comprises copper plate and is shaped generally as an S-configuration. The terminal bar 62A comprises a bottom horizontal section 96A, a vertical section 98A and a top horizontal section 100A. The bottom section 96A preferably defines two apertures 102A. The printed wiring board 72 also defines two apertures 103A (FIG. 4) corresponding to the apertures 102A of the bar 62A. The rivets 94 pass through the apertures to couple the bottom section 96A with the printed wiring board 72. The vertical section 98A defines an aperture 104A. The top section 100A defines an aperture 105A. The terminal bar 62B preferably comprises the same material, is shaped in substantially the same configuration, and has similar apertures. Since the terminal bar 62B is similar to the terminal bar 62A except for its size and except for the positions of the apertures, the same reference numerals are assigned to corresponding portions of the terminal bar 62B but with the letter B. Because the sizes of the respective terminal bars 62A, 62B and the positions of the apertures 104A, 105A, 105B are shown in FIGS. 6–10, further descriptions about the sizes and the positions are not deemed necessary. Note that the bottom apertures (not shown) of the terminal bar 62B are positioned to match the apertures 103B in FIG. 4.

The capacitor 64 has a pair of terminals 106A, 106B that are disposed on the same side and are formed with threaded holes. Two bolts 108A, 108B are fitted into the apertures 104A, 104B of the respective terminal bars 62A, 62B and are further fitted into the threaded holes of the terminals 106A, 106B. Thus, the vertical sections 98A, 98B of the terminal bars 62A, 62B together support the capacitor 64. A pair of power cables can be connected with the respective apertures 105A, 105B to couple the terminal bars 62A, 62B with the battery 58.

Another terminal bar 62C, which is similar to the terminal bars 62A, 62B, is affixed to the printed wiring board 72 below the circuit board 88. Although the terminal bar 62C only has a nominal vertical section and no aperture is provided in the vertical section, the same reference numerals are assigned to the corresponding portions but with the letter C. Note that the bottom apertures (not shown) of the terminal bar 62C are positioned to match the apertures 103C in FIG. 4. The terminal bar 62C is connected with the drains D of the FETs 66. A power cable can be connected with the aperture 105C to couple the terminal bar 62C with the motor 54.

Although not shown in FIGS. 6–8, the speed control circuit 60 (FIG. 3) can be disposed on the circuit board 88.

The speed control circuit 60 is connected to a potentiometer that is provided at the control mechanism through plurality of signal lines 112, which are tied together by a tubular member 114.

Figure 11:
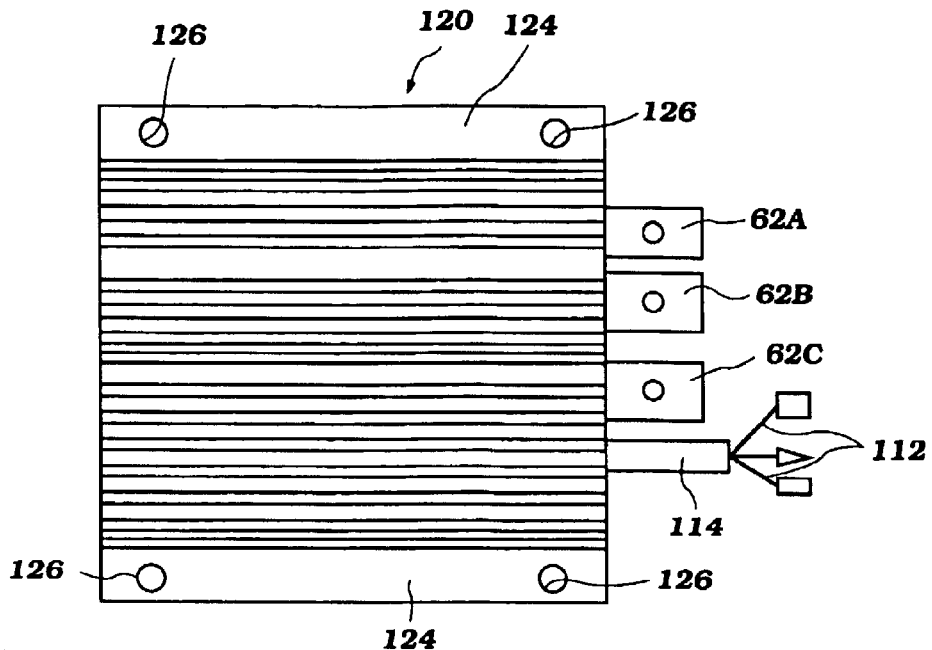
FIG. 11 is a plan view of the motor controller with a casing.
Figure 12:
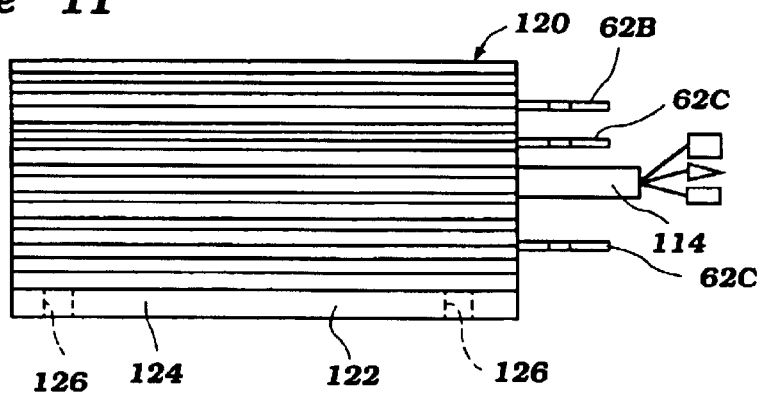
FIG. 12 is a front elevational view of the motor controller with the casing.
Figure 13:
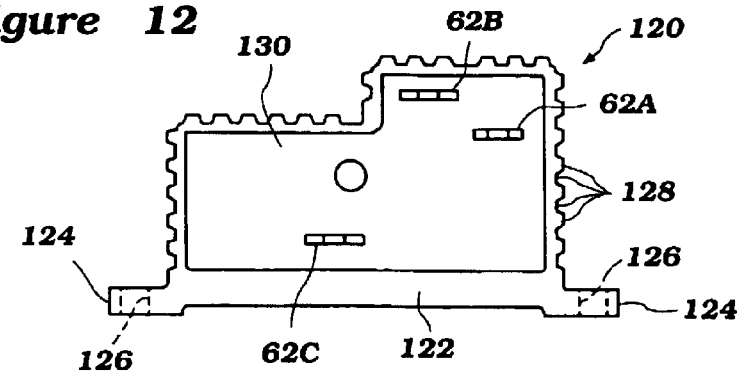
FIG. 13 is side view of the motor controller with the casing viewed from a location on the right hand side.

As shown in FIGS. 11–13, a protective casing 120 encloses the motor controller 50. The casing 120 preferably is made of aluminum and is configured generally as a rectangular parallelepiped tubular shape except for one top corner portion. Although any method can be used to produce the casing 120, either an extrusion molding process or a die-cast molding process is the most suitable method.

The entire body of the controller 50, except for the terminal bars 62A, 62B, 62C and the tubular member 114, is accommodated within the casing 120. A bottom portion 122 of the casing 120 has openings corresponding to the openings 84 of the printed wiring board 72. The printed wiring board 72 thus is affixed to the bottom portion 122 by rivets through the openings. The bottom portion 122 has flanges 124 that extend along both lateral sides. The flanges 124 also define openings 126 through which bolts can pass to mount the casing onto an appropriate location of the golf cart. Top and lateral surfaces of the casing 120 form a plurality of grooves (or projections) 128 extending in parallel to each other and along the flanges 124. The grooves (or projections) 128 advantageously increase the surface area of the casing 120 to expedite radiation of heat from the casing 120. Within the casing 120, the space that is not occupied by the motor controller 50 is filled with synthetic resin. Although the synthetic resin 130 can be the same as the synthetic resin 80, a lower grade resin than the resin 80 (FIGS. 4 and 5) can be sufficient enough to fill the space.

As thus described, the FETs 66 and the diodes 68 are directly joined to the metallic substrate 72 that is fixed to the protective casing 120 without any specific heat radiator. Many parts, elements and members can be omitted, and the casing 120 can be extremely compact. Since the motor controller 50 is completely enclosed in the synthetic resin 130 and is firmly coupled with the casing 120 by the resin 130, condensation, dust and vibration cannot harm the motor controller 50.

Figure 14:
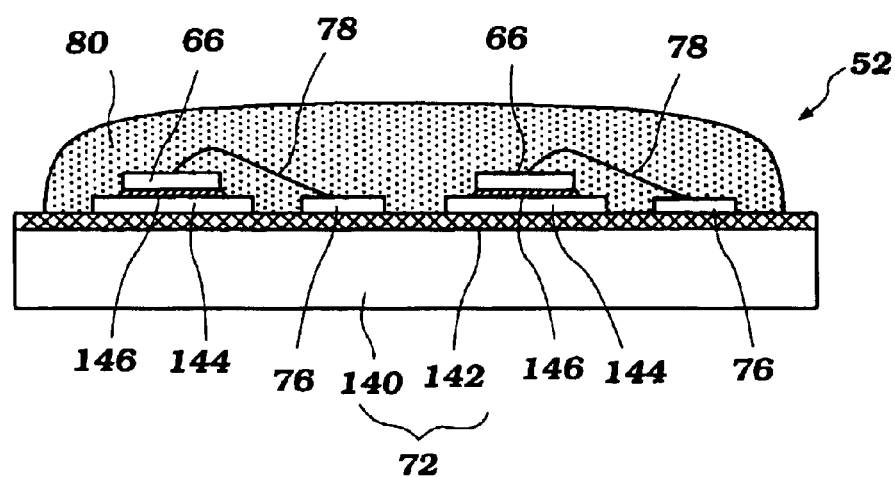
FIG. 14 is a schematic front view of the semiconductor device that corresponds to the semiconductor device of FIG. 5.

As shown in FIG. 14, the structure of the semiconductor device 52 will now be described in greater detail below.

The metallic substrate 72 preferably comprises a base metal 140 coated with a dielectric or insulating layer 142. Preferably the base metal 140 comprises aluminum, which has a coefficient of linear expansion of approximately 23 ppm/° K. Patterns of metallic lands 144 are printed on the insulating layer 142. The lands 144 preferably comprise copper, which has a coefficient of linear expansion of approximately 16–17 ppm/° K. As used in this description, the terms "aluminum," and "copper" include aluminum alloy and copper alloy, respectively. The semiconductor chips 66, which are FETs in the illustrated embodiment, are directly soldered onto the lands 144 by solder 146 without any intervening substances such as the conventional heat spreaders. Patterns of the wire bonding pads 76 also are printed on the insulating layer 142 and are connected to the respective semiconductor chips 66 through the bonding wires 78. After completion of the soldering and bonding processes, the synthetic resin 80 covers the lands 144, the semiconductor chips 66, the solder layer 146, the bonding pads 76 and the bonding wires 78. In other words, the synthetic resin 80 completely encloses all the elements on the substrate 72 therein.

It has been found in experiments that cracks of the solder layer 146 or the FETs 66 (i.e., the semiconductor chips) and peeling of the FETs 66 from the solder layer 146 are effectively prevented without the conventional heat spreaders if the synthetic resin 80 at least meets the following condition. Preferably, the synthetic resin 80 is epoxide that has a coefficient of linear expansion generally less than 23 ppm/°K. The resin under this condition effectively relieves the thermal stress affected to the solder layer 146. Other synthetic resins may be used instead of the epoxide, but the resin should have a coefficient of linear expansion less than the coefficient of linear expansion of the lands 144 or the coefficient of linear expansion of the substrate 72 in order to produce the beneficial effect described above. In other words, the coefficient of linear expansion of the resin is generally less than one of the coefficient of linear expansion of the substrate 72 and the coefficient of linear expansion of the lands 144, and the coefficient of linear expansion of the resin is generally greater than the other one of the coefficient of linear expansion of the substrate 72 and the coefficient of linear expansion of the lands 144. Adjustment of the proportions of the components of the synthetic resin can produce the desired coefficient of linear expansion. No side walls are necessary if the epoxide is applied because the epoxide has sufficient viscosity. Materials other than aluminum or copper can be used for the substrate or the lands inasmuch as the foregoing condition is met.

Various methods such as, for example, a reflow soldering method or a die bonding method can be used to produce the semiconductor device 52. In the reflow soldering method, cream solder or half-solid solder is applied on all the lands 144 simultaneously. Then, the semiconductor chips 66 are placed on the respective lands 144 by, for example, a chip mounter. The substrate 72 with the semiconductor chips 66 placed on the lands 144 by the cream solder is put into a reflow furnace. The furnace generates a hot blast therein that reflows and then hardens the solder to firmly fix the semiconductor chips 66 onto the lands 144. The wire bonding pads 76 can be printed on the substrate 72 at the same time as the lands 144 are printed or later in another process. In either case, the wires 78 are bonded between the semiconductor chips 66 and the wire bonding pads 76 afterwards. Finally, the synthetic resin 80, which is the epoxide that has the selected coefficient of linear expansion, is injected by a resin dispenser onto the substrate 72 on which the semiconductor chips 66 are joined. In the die bonding method, the semiconductor chips 66 are placed and soldered onto the lands 144 one by one. A wire bonding process follows each placing and soldering process and thus is done also one by one. Other processes are substantially the same as the processes in the reflow soldering method.

As thus described, no heat spreaders are necessary. Also, the solder layer can have a thickness that does not cause any cracks. The semiconductor device thus has sufficient packaging density to make the device compact enough. In addition, at least the soldering process of the heat spreader can be omitted. Thus, production cost of the semiconductor device can greatly be saved.

As shown in FIGS. 15–19, a number of preferred patterns of the lands 144 can be used to accurately position the semiconductor chips 66 thereon, as described below.

The semiconductor chips 66 are accurately positioned on the lands 144 so that the substrate 72 can be compact enough. The illustrated patterns in FIGS. 15–19 are applied in a soldering manner as part of the foregoing reflow soldering method. A conventional reflow soldering method typically needs several mounting tools to position the semiconductor chips on the lands. However, the method using the patterns does not require such a tool and thus is quite simple and cost saving. The patterns are specifically suitable for semiconductor chips which have rectangular or square shapes.

Figures 15, 16:
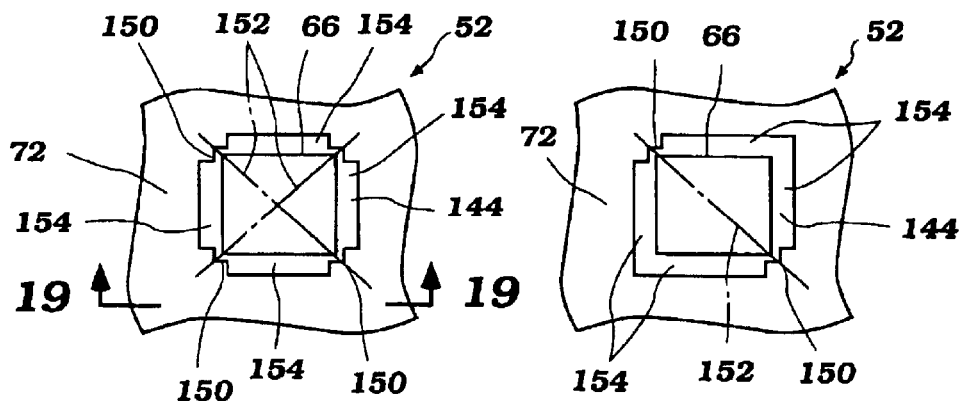
FIG. 15 is a schematic, partial top plan view of the semiconductor device that has a land pattern configured in accordance with a preferred arrangement of the present invention.
FIG. 16 is a schematic, partial top plan view of the semiconductor device that has a modified land pattern.
Figure 19:
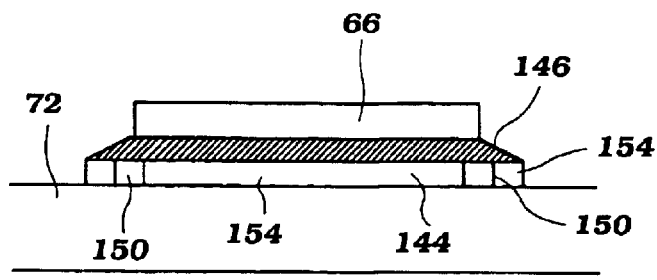
FIG. 19 is a schematic, partial side view of the semiconductor device viewed from the line 19—19 of FIG. 15.

FIG. 15 illustrates a preferred pattern of the land 144 that has four positioning or alignment corners 150 on lines 152, which include diagonal lines of the semiconductor chip (i.e., FET 66) in this embodiment. As shown in FIG. 19, the land 144 is formed on the substrate 72. The solder layer 146, which is cream solder or half-solid solder as noted above, is applied on the land 144 so that the solder 146 exactly spreads over the area of the land 144. The semiconductor chip 66 is placed on the solder layer 146. In the illustrated arrangement, four corners or peaked portions of the semiconductor chip 66 are confined or trapped in the respective positioning corners 150 of the land pattern. That is, the corners 150 of the land 144 are disposed in close proximity to the corners of the semiconductor chip 66. The closer the positioning corners 150 of the land 144 are to the corners of the semiconductor chip 66, the more accurately the semiconductor chip 66 is positioned.

The land pattern also has four extended areas 154 along four sides of the semiconductor chip 66. In other words, the positioning corners 150 are the closest portions of the land 144 to the corners of the semiconductor chip 66. Further, the entire area of the land 144 is larger than the entire area of the semiconductor chip 66, and the area of the land 144 generally shrinks toward the corners of the semiconductor chip 66. Each extended area 154 in this pattern generally has a square configuration.

The extended areas 154 are useful to expand the entire area of the solder layer 146 that abuts on the land 144 and to allow bubbles in paste of the solder 146 to escape. The paste is employed to easily join the solder 146 with the land 144 and with the semiconductor chip 66; however, the paste may contain flux. Because the solder 146 is heated in the aforenoted reflow furnace, the flux can grow to bubbles and can make voids between the semiconductor chip 66 and the land 144. The extended areas 154 aid the bubbles to rapidly escape from the in-between areas. Because of the extended areas 154, substantially no voids can be made, and the land 144, the solder 146 and the semiconductor chip 66 can strictly join with each other. This has been verified experimentally. The wider the extended areas 154, the easier the bubbles escape inasmuch as the areas 154 do not affect the compact nature of the semiconductor device 52.

FIG. 16 illustrates a modified pattern of the land 144. Two positioning corners 150 are made on a line 152 including one of the diagonal lines of the semiconductor chip 66 in this arrangement. This arrangement can also confine at least two of the corners of the semiconductor chip 66 and is sufficient to accurately position the semiconductor chip 66 on the land 144. Because the rest of the corners of the land 144 do not form the positioning areas, the extended areas 154 can extend wider than the pattern of FIG. 15 and thus bubbles in the paste can escape easier than the pattern of FIG. 15.

Figures 17, 18:
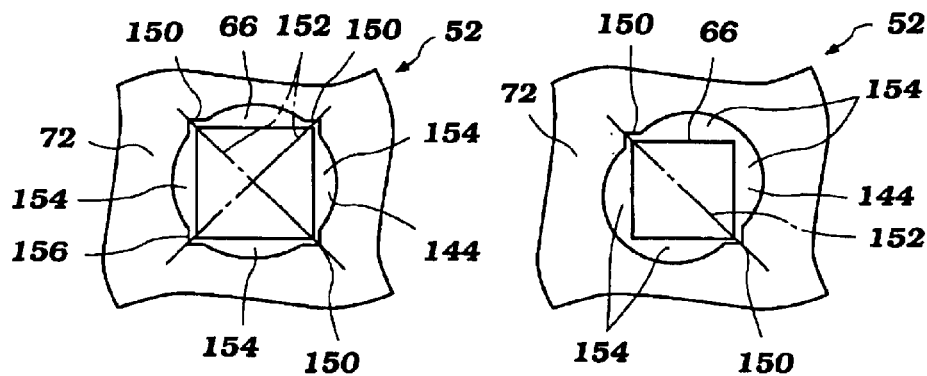
FIG. 17 is a schematic, partial top plan view of the semiconductor device that has a further modified land pattern.
FIG. 18 is a schematic, partial top plan view of the semiconductor device that has a still further modified land pattern.

The extended areas 154 can take any configurations. For example, FIG. 17 illustrates another modified pattern of the land 144. The pattern in this arrangement has four positioning corners 150 similar to the pattern shown in FIG. 15 but has round or arc shaped extended areas 154.

FIG. 18 illustrates a further modified pattern of the land 144. This pattern has two positioning corners 150 similar to the pattern shown in FIG. 16 but has a round shape or generally circular shape.

Any configuration of the semiconductor chip 66 can be used with the positioning corners 150 of the land 144 inasmuch as the configuration has at least one diagonal line. That is, the configurations can include, for example, any rectangular and square shapes. The positioning corners 150 of the land 144 are particularly effective with such semiconductor chips 66 that have at least a side whose length is longer than approximately 2.5 millimeters. If the semiconductor chip has a rectangular shape, at least a length of a shorter side thereof is longer than approximately 2.5 millimeters. This is because the size of a larger size of the semiconductor chip 66 normally needs a margin of the land 144 that can exceed an allowable range in which the semiconductor chip 66 can be offset from a preset position. If a large offset from the preset position would occur, wires which are bonded to the wire bonding pads in a following wire bonding process could deviate from normal positions. However, the positioning corners 150 configured in accordance with the present invention can precisely confine the corners of the semiconductor chip 66 in a preset normal position.

The sufficient extended areas 154 of the land 144 are particularly effective with a power control semiconductor chip 66 because creation of voids can be extremely reduced. If a plurality of voids are created in the solder or the junction thereof with the semiconductor chip 66, resistance can greatly increase. Since a relatively large current flows through the power controlling semiconductor chip, the increase of the resistance can be greater and much power loss can occur. To the contrary, however, because of the extreme reduction of the voids in this arrangement, such a drawback cannot occur even with the power controlling semiconductor chip 66.

FIG. 20 illustrates steps of an exemplified reflow soldering method in which the land patterns of FIGS. 15–19 can be applied. Electronic parts other than the semiconductor chips 66 are joined to the substrate 72 in this exemplified method. At a step S11, a chip mounter and a part mounter or a unified chip and part mounter mounts the semiconductor chips 66 and the parts onto each predetermined location on the substrate 72. The cream solder 146 is previously applied on the respective lands 144. Then, the substrate 72 is put into the reflow furnace at a step S12 to harden the cream solder 146 by the hot blast. Because of the positioning corners 150 of the land patterns, no tool is necessary to keep the semiconductor chips 66 at the accurate positions in this improved manner.

The semiconductor chips 66 can of course be joined to the lands 144 in other methods. For instance, FIG. 21 illustrates another method using the reflow furnace and die bonders. At a step S21, a part mounter mounts parts onto each predetermined location on the substrate 72. The cream solder 146 is previously applied at the respective portions of the parts which are soldered. The substrate 72 is put into the reflow furnace at a step S22 to fix the parts at the locations. At a next step S23, a die bonder A is used to join a first type of semiconductor chip or chips A to the substrate 72. The die bonder A bonds or joins only the first type of the semiconductor chips A. At a step S24, another die bonder B joins a second type of semiconductor chip or chips B to the substrate 72. In the same manner, at a step S25, a further die bonder C bonds a third type of semiconductor chip or chips C to the substrate 72. As such, further die bonders are used to join further types of semiconductor chips to the substrate 72 in due order. This method requires multiple die bonders corresponding to the respective types of semiconductor chips. However, the semiconductor chips can be mounted precisely onto the desired positions without any mounting tool.

Figure 23:
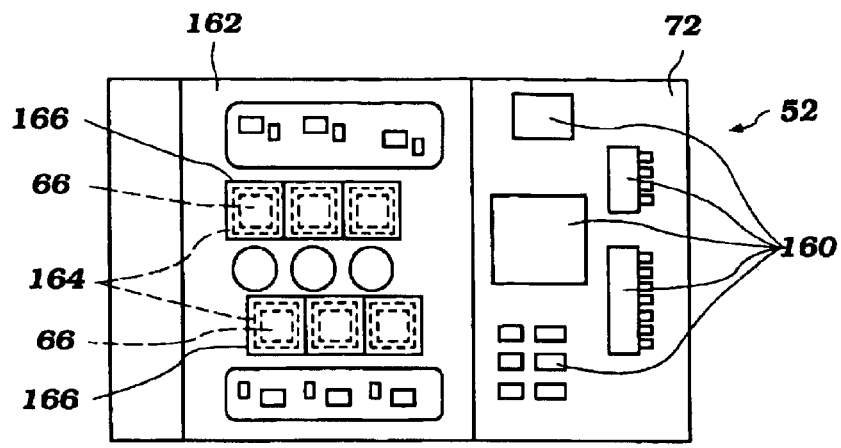
FIG. 23 is a schematic top plan view of the semiconductor device with a mounting tool used for practicing the production processes shown in FIG. 22.
Figure 24:
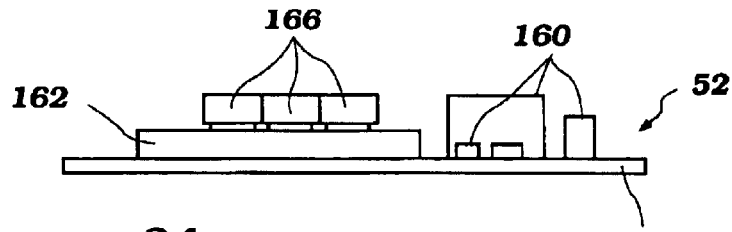
FIG. 24 is a schematic front elevational view of the semiconductor device of FIG. 23 with the tool.
Figure 25:
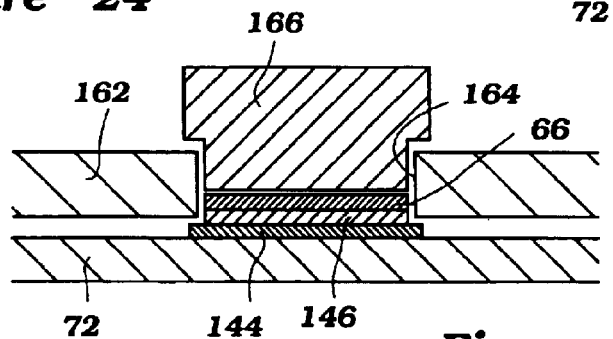
FIG. 25 is an enlarged sectional view of the semiconductor device of FIG. 23 with the tool.
Figure 26:
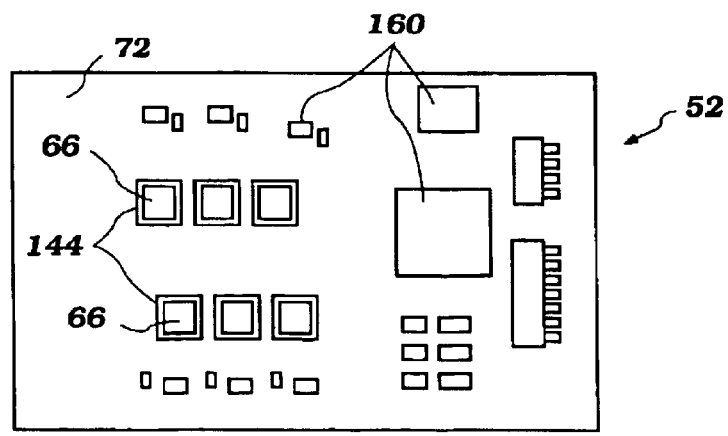
FIG. 26 is a top plan view of the semiconductor device of FIG. 23 without the tool.

FIGS. 22–26 illustrate a further method using the reflow furnace and a mounting tool. As shown in FIG. 22, at a step S31, the part mounter mounts parts 160 onto each predetermined location on the substrate 72 as shown in FIGS. 23–25. The cream solder 146 is previously applied at the respective portions of the parts which are soldered. At a next step S32, a mounting tool 162 is set for positioning the semiconductor chips 66 at predetermined locations. The tool 162 has windows 164 through which the semiconductor chips 66 can be mounted. The chip mounter, at a step S33, mounts the semiconductor chips 66 onto the cream solder 146 applied on the lands 144 through the windows 164. Weights 166 are placed on the respective semiconductor chips 66. At a step 534, the substrate 72 with the semiconductor chips 66 and the parts 160 are put in the reflow furnace to fix to the substrate 72 by the hot blast. In this step 534, the tool 162 advantageously prevents the semiconductor chips 66 from slipping off the preset positions. The weights also are useful to prevent voids from being generated in the solder 146 or to expedite the bubbles to escape from the solder 146 in the step S34. At a last step S35, the tool 162 and the weights 166 are detached.

The foregoing description is that of preferred constructions and methods having certain features, aspects and advantages in accordance with the present invention. Various changes and modifications may be made to the above-described arrangements without departing from the spirit and scope of the invention, as defined by the appended claims.

What is claimed is:

1. A semiconductor device comprising an aluminum substrate, a copper land formed on the substrate, a semiconductor chip mounted on the land, a solder layer only through which the semiconductor chip is joined with the land, and an epoxide synthetic resin, the epoxide synthetic resin having a coefficient of expansion generally less than approximately 23 ppm/°K and generally greater than the coefficient of expansion of the copper land, the epoxide synthetic resin covering the land, the solder layer, and the semiconductor chip.

2. The semiconductor device as set forth in claim 1, wherein the semiconductor chip defines at least two corners positioned generally opposite to each other, the land has an outer boundary that defines at least two corner portions in proximity to the corners of the semiconductor chip, the outer boundary further defines contiguous portions extending next to the corner portions and spaced apart from the semiconductor chip more than the corner portions, and the corner portions of the land generally confine the corners of the semiconductor chip therein.

3. The semiconductor device as set forth in claim 1, wherein the semiconductor chip controls electric power.

4. The semiconductor device as set forth in claim 3, wherein the semiconductor chip controls power of an electric motor arranged to drive an electric vehicle.

* * * * *